US008710548B2

(12) United States Patent
Yanagihara et al.

(10) Patent No.: US 8,710,548 B2

(45) Date of Patent: Apr. 29, 2014

(54) SEMICONDUCTOR DEVICE AND METHOD FOR MANUFACTURING THE SAME

(75) Inventors: Manabu Yanagihara, Osaka (JP); Kazushi Nakazawa, Osaka (JP); Tsuyoshi Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 996 days.

(21) Appl. No.: 12/795,143

(22) Filed: Jun. 7, 2010

(65) Prior Publication Data

US 2010/0244045 A1 Sep. 30, 2010

Related U.S. Application Data

(62) Division of application No. 11/363,947, filed on Mar. 1, 2006, now Pat. No. 7,821,030.

(30) Foreign Application Priority Data

Mar. 2, 2005 (JP) ................................ 2005-058040

(51) Int. Cl.
*H01L 29/778* (2006.01)

(52) U.S. Cl.
USPC .... 257/192; 257/194; 257/284; 257/E29.246; 257/172; 257/197; 257/242; 257/245; 257/253; 257/275; 257/276

(58) Field of Classification Search
USPC .......... 257/192, 200, 201, E29.091, E29.253, 257/E29.255, E29.264
See application file for complete search history.

(56) References Cited

U.S. PATENT DOCUMENTS

| | | | | |
|---|---|---|---|---|
| 4,833,508 A | | 5/1989 | Ishikawa et al. | |
| 6,107,649 A | | 8/2000 | Zhao | |
| 7,755,108 B2 | * | 7/2010 | Kuraguchi | 257/199 |
| 7,834,380 B2 | * | 11/2010 | Ueda et al. | 257/192 |
| 7,932,539 B2 | * | 4/2011 | Chen et al. | 257/194 |
| 7,956,383 B2 | * | 6/2011 | Kuroda et al. | 257/192 |
| 7,960,756 B2 | * | 6/2011 | Sheppard et al. | 257/192 |
| 2005/0133818 A1 | * | 6/2005 | Johnson et al. | 257/192 |
| 2006/0065908 A1 | | 3/2006 | Beach | |

FOREIGN PATENT DOCUMENTS

| | | |
|---|---|---|
| JP | 05-136177 | 6/1993 |
| JP | 2000-100831 | 4/2000 |
| JP | 2002-359256 | 12/2002 |
| JP | 2004-200248 | 7/2004 |
| JP | 2006-156429 | 6/2006 |
| WO | WO 2004/061978 A1 | 7/2004 |

OTHER PUBLICATIONS

United States Notice of Allowance issued in U.S. Appl. No. 11/363,947 dated Jul. 20, 2010.

Li et al., "High breakdown voltage Gan HFET with field plate", Electronics Letters, Feb. 1, 2001, vol. 39, No. 3.

Japanese Notice of Reasons for Rejection, w/ English translation thereof, issued in Japanese Patent Application No. JP 2006-054824 dated Apr. 28, 2009.

* cited by examiner

*Primary Examiner* — Zandra Smith
*Assistant Examiner* — Tsz Chiu
(74) *Attorney, Agent, or Firm* — McDermott Will & Emery LLP

(57) ABSTRACT

A semiconductor device includes a first semiconductor layer which is formed above a substrate, a Schottky electrode and an ohmic electrode which are formed on the first semiconductor layer to be spaced from each other and a second semiconductor layer which is formed to cover the first semiconductor layer with the Schottky electrode and the ohmic electrode exposed. The second semiconductor layer has a larger band gap than that of the first semiconductor layer.

15 Claims, 6 Drawing Sheets

SEMICONDUCTOR DEVICE AND METHOD FOR MANUFACTURING THE SAME

CROSS REFERENCE TO RELATED APPLICATIONS

This application is a divisional of U.S. patent application Ser. No. 11/363,947 filed on Mar. 1, 2006, now U.S. Pat. No. 7,821,030, claiming priority of Japanese Patent Application No. 2005-058040, filed on Mar. 2, 2005 in Japan, the disclosures of which Applications are incorporated by reference herein.

BACKGROUND OF THE INVENTION

1. Field of the Invention

The present invention relates to a semiconductor device including a Schottky electrode made of nitride semiconductor material and a method for manufacturing the same.

2. Description of Related Art

Group III-V nitride semiconductors containing indium (In), aluminum (Al) and gallium (Ga) and represented by the general formula: $In_xAl_yGa_{1-x-y}N$ ($0 \leq x$, $y \leq 1$, $x+y \leq 1$) have unique characteristics which are not shown by conventionally used Si and GaAs, such as high breakdown electric field and high saturated electron velocity. At an interface between typical AlGaN/GaN hetero junction, two dimensional electron gas (2DEG) in as extremely high concentration as $1\times10^{13}$ $cm^{-2}$ is generated by the effects of spontaneous polarization and piezopolarization. By making full use of the characteristics, electron devices such as field effect transistors (FET) and Schottky bather diodes (SBD) using the nitride semiconductors have actively been developed in recent years.

For the development of the devices using the group III-V nitride semiconductors, improvement in dielectric strength and reduction in leakage current are particularly important. GaN-based materials have high breakdown electric field. However, in a device such as FETs and SBDs, electric field concentration occurs in a particular location to cause breakdown in the device at a voltage extremely lower than the breakdown electric field. Further, the GaN-based materials are likely to produce deep surface states, through which leakage current flows between the electrodes.

For the purpose of reducing the electric field concentration and improving the dielectric strength, there is a known technique of providing a gate electrode of an FET with a field plate (e.g., see Japanese Unexamined Patent Publication No. 2004-200248 and "Electronic Letters", 2001, Vol. 37, No. 3, pp. 196-197).

Hereinafter, an explanation of the conventional FET including the field plate will be provided with reference to the drawings. FIG. 10 shows the cross-sectional structure of the conventional FET. As shown in FIG. 10, a 1 μm thick undoped gallium nitride (GaN) layer 53 and a 25 nm thick n-doped aluminum gallium nitride (AlGaN) layer 54 are formed in this order on a sapphire substrate 5 with a buffer layer 52 made of aluminum nitride (AlN) sandwiched therebetween. A source electrode 56 and a drain electrode 57 serving as ohmic electrodes are formed on the AlGaN layer 54 to be spaced from each other. A gate electrode 58 is formed as a Schottky electrode between the source electrode 56 and the drain electrode 57. The gate electrode 58 is configured to extend over a SiN film 59 toward the drain electrode 57.

When a high voltage is applied to the drain electrode 57, in general, a highest electric field is applied to an end 58*b* of the gate electrode 58 facing the drain electrode 57. In this FET, part of the gate electrode 58 extending over the SiN film 59 toward the drain electrode 57 in the eave-like form serves as a field plate 58*a*. Therefore, the electric field generated between the gate electrode 58 and the drain electrode 57 is also distributed in the field plate 58*a*. Therefore, the field intensity at the end 58*b* of the gate electrode 58 facing the drain electrode 57 is reduced, thereby improving the dielectric strength of the device.

Also in the SBD, similar electric field concentration occurs between the Schottky electrode and the ohmic electrode. Therefore, the Schottky electrode is configured to have a field plate extending toward the ohmic electrode, thereby improving the dielectric strength.

As the surface of the AlGaN layer 54 is covered with the SiN film 59, leakage current is reduced as compared with the case where the AlGaN layer 54 is exposed to air.

The conventional technique improves the dielectric strength effectively as described above. However, the technique is hardly effective in reducing leakage current which occurs on the application of a reverse bias.

In a III-V nitride semiconductor device, a surface layer is generally made of AlGaN which is a mixed crystal of Ga and Al and has a relatively small band gap. AlGaN has many crystal defects on the surface thereof and they produce deep surface states. Therefore, when a reverse bias is applied, leakage current flows between the electrodes through the surface states. Even if the surface of the AlGaN layer is covered with a SiN film, the surface state density hardly decreases. Therefore, it is almost impossible to reduce the leakage current.

SUMMARY OF THE INVENTION

In order to solve the conventional problems, an object of the present invention is to achieve a semiconductor device which makes it possible to reduce leakage current caused by the surface states of a semiconductor layer when a reverse bias is applied.

In order to achieve the object, the present invention provides a semiconductor device including a surface-protecting semiconductor layer having a large band gap.

Specifically, the semiconductor device of the present invention includes: a first semiconductor layer which is formed above a substrate; a Schottky electrode and an ohmic electrode which are formed on the first semiconductor layer to be spaced from each other; and a second semiconductor layer which is formed to cover the first semiconductor layer with the Schottky electrode and the ohmic electrode exposed and has a larger band gap than that of the first semiconductor layer.

In the semiconductor device of the present invention, the first semiconductor layer is not exposed and the second semiconductor layer having a large band gap and stability reduces the surface state density at the surface of the first semiconductor layer. Therefore, the leakage current which occurs between the ohmic electrode and the Schottky electrode on the application of a reverse bias is reduced.

In the semiconductor device of the present invention, the side of the Schottky electrode facing the ohmic electrode is configured to extend over the top surface of the second semiconductor layer toward the ohmic electrode. According to this structure, electric field concentration at the end of the Schottky electrode facing the ohmic electrode is prevented by the effect of the field plate. Therefore, the dielectric strength between the ohmic electrode and the Schottky electrode improves. Further, as two dimensional electron gas is generated between the second semiconductor layer and the first semiconductor layer, substantial contact area between the Schottky electrode and the first semiconductor layer increases, thereby increasing forward current.

In this case, it is preferable that the semiconductor device further includes an insulating film which is formed on the second semiconductor layer and the side of the Schottky electrode facing the ohmic electrode is configured to extend over the top surface of the insulating film toward the ohmic electrode. According to this structure, electric field concentration at the interface between the Schottky electrode and the second semiconductor layer is reduced, thereby improving the dielectric strength to a further extent.

In this case, the insulating film is preferably made of silicon nitride. According to this structure, the surface state density at the surface of the second semiconductor layer is expected to be reduced.

In the semiconductor device of the present invention, the second semiconductor layer is preferably an epitaxial layer which is epitaxially grown on the first semiconductor layer. According to this structure, the surface state density due to the rearrangement of atoms at the surface of the first semiconductor layer is reduced, thereby reducing the leakage current with reliability. Further, two dimensional electron gas is surely generated between the second semiconductor layer and the first semiconductor layer, thereby increasing forward current.

It is preferable that the semiconductor device of the present invention further includes a third semiconductor layer which is formed between the first semiconductor layer and the substrate and has a smaller band gap than that of the first semiconductor layer. In this case, it is preferable that the first semiconductor layer is made of a compound represented by the general formula: $Al_xGa_{1-x}N$ ($0.15 \leq x \leq 0.35$), the second semiconductor layer is made of a compound represented by the general formula: $Al_yGa_{1-y}N$ ($x+0.15 \leq y \leq 1$) and the third semiconductor layer is made of gallium nitride. According to this structure, crystal growth of the first semiconductor layer occurs easily on the third semiconductor layer and high concentration two dimensional electron gas is generated at the interface between the third semiconductor layer and the first semiconductor layer. Further, as the difference in band gap between the first and second semiconductor layers is made sufficiently large, the leakage current is reduced with reliability.

In the semiconductor device of the present invention, it is preferable that the first semiconductor layer contains n-type impurities. According to this structure, a channel is formed in the first semiconductor layer.

A method for manufacturing a semiconductor device according to the present invention preferably includes the steps of: (a) forming a first semiconductor layer and a second semiconductor layer which has a larger band gap than that of the first semiconductor layer in this order above a substrate; (b) forming a first opening in the second semiconductor layer to expose the first semiconductor layer; (c) forming a second opening in the second semiconductor layer at a position spaced from the first opening to expose the first semiconductor layer; (d) forming a Schottky electrode on the first semiconductor layer exposed in the first opening; and (e) forming an ohmic electrode on the first semiconductor layer exposed in the second opening.

According to the method of the present invention, the electrodes are formed in the first semiconductor layer and the second semiconductor layer having a larger band gap than that of the first semiconductor layer is formed on the first semiconductor layer. Therefore, the semiconductor device is obtained with reduced leakage current.

As to the method of the present invention, it is preferable that in the step (d), the Schottky electrode is formed to extend over the top surface of the second semiconductor layer toward the ohmic electrode. According to this structure, electric field concentration at the end of the Schottky electrode facing the ohmic electrode is reduced by the effect of the field plate. Therefore, the semiconductor device is obtained with high dielectric strength.

As to the method of the present invention, it is preferable that in the step (a), the second semiconductor layer is epitaxially grown on the first semiconductor layer. According to this structure, the surface state density due to the rearrangement of atoms at the surface of the first semiconductor layer is reduced, thereby reducing the leak current with reliability. Further, two dimensional gas is surely generated at the interface between the second semiconductor layer and the first semiconductor layer, thereby increasing forward current.

As to the method of the present invention, it is preferable that in the step (a), a mask is formed on part of the top surface of the first semiconductor layer for forming the first opening and then the second semiconductor layer is epitaxially grown on the first semiconductor layer and in the step (b), the mask is removed to form the first opening. According to this structure, the first opening is formed without etching the second semiconductor layer. Therefore, the first and second semiconductor layers are not damaged by the etching. Further, there is no possibility of over-etching the surface of the first semiconductor layer.

It is preferable that the method of the present invention further includes: the step of forming an insulating film on the second semiconductor layer; and the step of forming a second opening in the insulating film to expose part of the top surface of the second semiconductor layer including a region for forming the first opening before the step (d), wherein in the step (d), the Schottky electrode is formed to fill the second opening and extend over the top surface of the insulating film toward the ohmic electrode. According to this structure, electric field concentration at the interface between the Schottky electrode and the second semiconductor layer is reduced.

It is preferable that the method of the present invention further includes the step of forming a third semiconductor layer which contacts the first semiconductor layer and has a smaller band gap than that of the first semiconductor layer between the first semiconductor layer and the substrate before the step (a). In this case, it is preferable that the first semiconductor layer is made of a compound represented by the general formula: $Al_xGa_{1-x}N$ ($0.15 \leq x \leq 0.35$), the second semiconductor layer is made of a compound represented by the general formula: $Al_yGa_{1-y}N$ ($x+0.15 \leq y \leq 1$) and the third semiconductor layer is made of gallium nitride. According to this structure, the difference in band gap between the first and second semiconductor layers is made sufficiently large. Therefore, the semiconductor device is provided with reduced leakage current.

As to the method of the present invention, it is preferable that the first semiconductor layer contains n-type impurities. According to this structure, a channel is formed in the first semiconductor layer.

DETAILED DESCRIPTION OF THE INVENTION

First Embodiment

Figure 1:
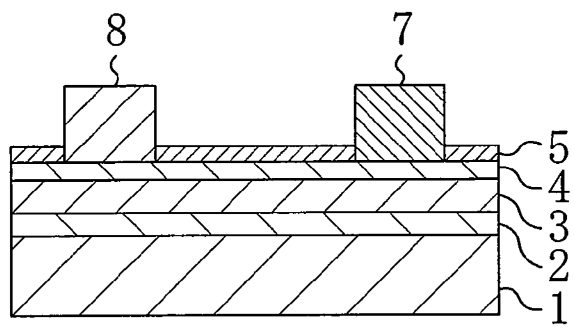
FIG. 1 is a sectional view illustrating a semiconductor device according to a first embodiment of the present invention.

A first embodiment of the present invention will be explained with reference to the drawings. FIG. 1 shows the cross-sectional structure of a semiconductor device according to the first embodiment. As shown in FIG. 1, the semiconductor device of the present embodiment is a Schottky barrier diode (SBD). A 1 μm thick channel layer 3 made of undoped GaN, a 25 nm thick electron supply layer 4 made of partially n-doped $Al_{0.25}Ga_{0.75}N$ and a 10 nm thick semiconductor protection layer 5 made of undoped AlN are epitaxially grown in this order on an AlN buffer layer 2 formed on a sapphire substrate 1. An ohmic electrode 7 made of a 10 nm thick titanium (Ti) layer and a 200 nm thick aluminum (Al) layer which are stacked in this order from below and a Schottky electrode 8 made of a 50 nm thick nickel (Ni) layer and a 200 nm thick gold (Au) layer which are stacked in this order from below are formed to penetrate the semiconductor protection layer 5 to contact the electron supply layer 4. The ohmic electrode 7 and the Schottky electrode 8 are spaced from each other.

On the surface of the SBD of the present embodiment, the AlN semiconductor protection layer 5 having a large band gap, a stable surface and small surface state density is provided. As the electron supply layer 4 made of AlGaN having large surface state density is not exposed, leakage current caused by the surface states of the electron supply layer 4 on the application of a reverse bias is significantly reduced.

Although the electron supply layer 4 of the present embodiment is made of $Al_{0.25}Ga_{0.75}N$, the material for the electron supply layer 4 may preferably be a compound represented by the general formula: $Al_xGa_{1-x}N$ ($0.15 \le x \le 0.35$) in which the mixed crystal ratio x of Al is 0.15 or more and 0.35 or less. In such a composition, the AlGaN layer is easily formed on the GaN channel layer 3 by crystal growth and high concentration 2DEG is generated at the interface between the electron supply layer 4 and the channel layer 3.

Although the semiconductor protection layer 5 is made of AlN free from Ga in the present embodiment, a compound which is represented by the general formula: $Al_yGa_{1-y}N$ ($0.15+x \le y \le 1$) and has a larger band gap than that of the electron supply layer 4 may also be used. If such a compound is used, it is expected that a difference in band gap between the semiconductor protection layer 5 and the electron supply layer 4 is made sufficiently large and the surface becomes stable.

Among the channel layer 3, electron supply layer 4 and semiconductor protection layer 5, at least the channel layer 3 may be made of a III-V nitride semiconductor containing In.

In the present embodiment, the SBD is taken as an example of the semiconductor device. However, the same structure is also applicable to FETs. In this case, AlN reduces the influence of the surface states, whereby a decrease in drain current at a high frequency, which is a phenomenon called frequency dispersion, is alleviated.

The AlN film used as the semiconductor protection layer 5 is not limited to an epitaxially grown monocrystalline film. For example, a polycrystalline AlN film may be formed by sputtering. In this case, damage to the surface of the electron supply layer 4 is prevented by controlling the sputtering power low or performing heat treatment after the sputtering. Thus, likewise when the semiconductor protection layer 5 is formed by epitaxial growth, the influence of the surface states becomes small, thereby improving the characteristics of the SBDs or FETs.

First Variant of the First Embodiment

Figure 2:
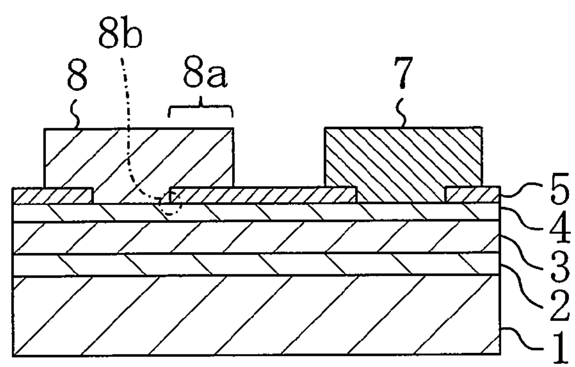
FIG. 2 is a sectional view illustrating a semiconductor device according to a first variant of the first embodiment of the present invention.

Hereinafter, an explanation of a first variant of the first embodiment will be provided with reference to the drawings. FIG. 2 shows the cross-sectional structure of a semiconductor device according to the first variant of the first embodiment. In FIG. 2, the same components as those shown in FIG. 1 are indicated by the same reference numerals to omit the explanation.

In the semiconductor device of the present variant, a Schottky electrode 8 is provided with a field plate **8*a* extending over the semiconductor protection layer 5 in the eave-like form as shown in FIG. 2. The field plate 8*a* reduces an electric field applied at an end 8*b* of the Schottky electrode 8 facing the ohmic electrode 7** on the application of a reverse bias. As a result, the dielectric strength of the SBD improves.

When a forward bias is applied, two dimensional electron gas (2DEG) is generated at part of an interface between the semiconductor protection layer 5 and the electron supply layer 4 below the field plate **8*a*. As a result, effective contact area between the Schottky electrode 8 and the electron supply layer 4** increases, thereby allowing large forward bias current to flow.

The size of the field plate **8*a* may suitably be adjusted depending on the gap between the Schottky electrode 8 and the ohmic electrode 7, the length of part of the Schottky electrode 8 contacting the surface of the electron supply layer 4 and the use conditions of the semiconductor device. For example, when the gap between the Schottky electrode 8 and the ohmic electrode 7 is 3 μm and the length of part of the Schottky electrode 8 contacting the surface of the electron supply layer 4 is 4 μm, the length of the field plate 8*a* contacting the surface of the semiconductor protection layer 5** is set to 2 μm.

In the present embodiment, the Schottky electrode 8 is configured such that other part than the field plate **8*a* slightly extends over the semiconductor protection layer 5. The ohmic electrode 7 is also configured to extend slightly over the semiconductor protection layer 5. Accordingly, the surface of the electron supply layer 4 is not exposed, thereby making the surface of the electron supply layer 4 stable. As a result, the SBD improves in reliability. However, the improvement in dielectric strength is achieved even if the extending parts other than the field plate 8***a* are not formed.

Figure 3:
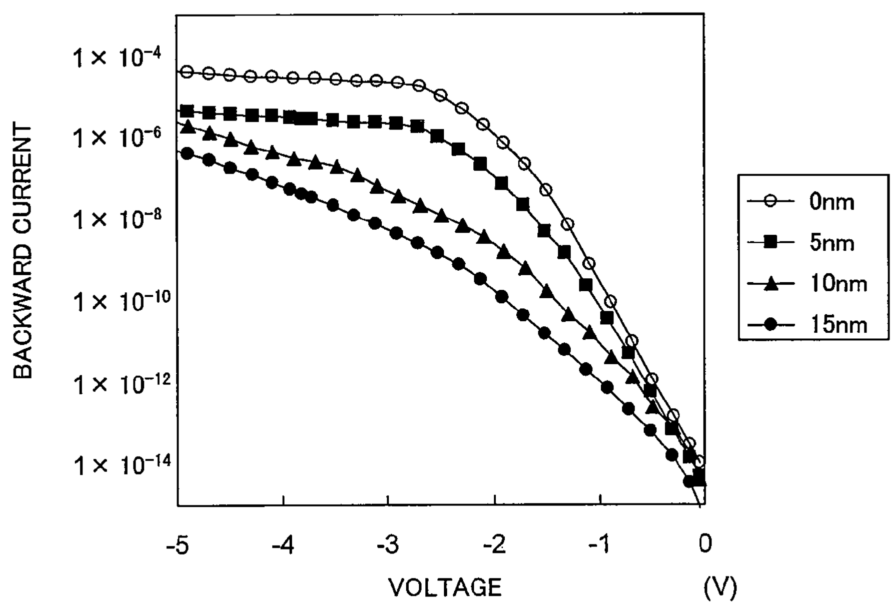
FIG. 3 is a graph illustrating the result of measurement simulation of a backward current characteristic of the semiconductor device according to the first variant of the first embodiment of the present invention.
Figure 4:
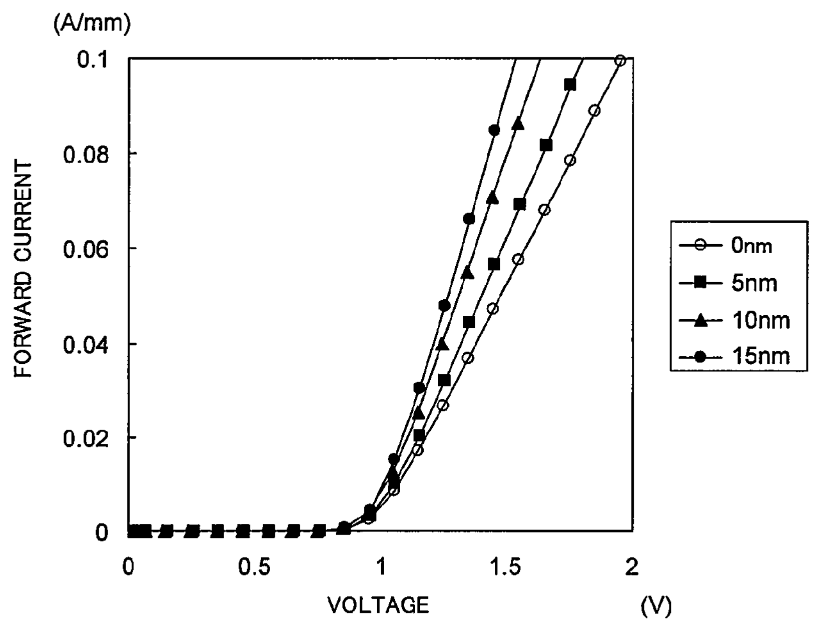
FIG. 4 is a graph illustrating the result of measurement simulation of a rearward current characteristic of the semiconductor device according to the first variant of the first embodiment of the present invention.

Hereinafter, an explanation of current and voltage characteristics of the SBD according to the present variant will be provided. FIGS. 3 and 4 are graphs illustrating the results of measurement simulation of the current and voltage characteristics of the SBD according to the present variant. FIG. 3 shows logarithmic plots of absolute values of backward current and FIG. 4 shows plots of forward current.

For the measurement simulation, the thickness of the channel layer 3 made of undoped GaN is set to 1 μm and the thickness of the electron supply layer 4 made of $Al_{0.25}Ga_{0.75}N$ is set to 25 nm, while the thickness of the semiconductor protection layer 5 made of AlN is varied in four levels of 0 nm, 5 nm, 10 nm and 15 nm.

As shown in FIG. 3, the backward leakage current decreases by providing the semiconductor protection layer 5. It is apparent from the plots that the semiconductor protection layer 5 reduces the influence of the surface states. The thicker the semiconductor protection layer 5 is, the more the backward leakage current decreases.

As shown in FIG. 4, the forward current flowing to the ohmic electrode increases by providing the semiconductor protection layer 5. A cause of the increase is that the provision of the semiconductor protection layer 5 brings about generation of 2DEG at part of the interface between the semiconductor protection layer 5 and the electron supply layer 4 below the field plate 8*a*. The thicker the semiconductor protection layer 5 is, the more the forward leakage current increases. Thus, it is indicated that the increase in thickness of the semiconductor protection layer 5 raises the concentration of 2DEG generated at the interface between the semiconductor protection layer 5 and the electron supply layer 4.

Second Variant of the First Embodiment

Figure 5:
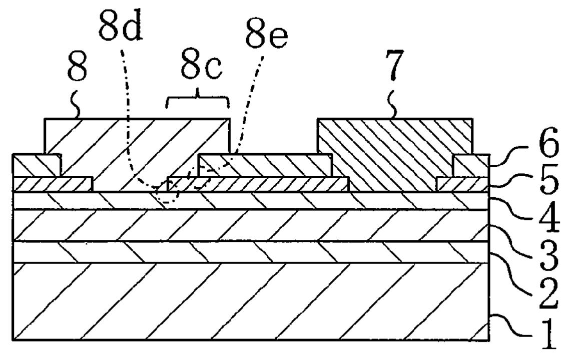
FIG. 5 is a sectional view illustrating a semiconductor device according to a second variant of the first embodiment of the present invention.

Hereinafter, an explanation of a second variant of the first embodiment will be provided with reference to the drawings. FIG. 5 shows the cross-sectional structure of a semiconductor device according to the second variant of the first embodiment. In FIG. 5, the same components as those shown in FIG. 2 are indicated by the same reference numerals to omit the explanation.

As shown in FIG. 5, the semiconductor device of the present variant is an SBD including an insulating film 6 which is formed on the semiconductor protection layer 5 and made of a 200 nm thick silicon nitride (SiN) film. The Schottky electrode 8 is provided with a two-stepped field plate 8*c* extending over the semiconductor protection layer 5 and the insulating film 6. Accordingly, electric field concentration is reduced both at an end 8*d* of the Schottky electrode 8 contacting the top surface of the electron supply layer 4 and facing the ohmic electrode 7 and an end 8*e* of the field plate 8*c* contacting the top surface of the semiconductor protection layer 5. Therefore, as compared with the single-stepped field plate, the dielectric strength improves to a further extent.

The size of the field plate 8*c* may suitably be adjusted depending on the gap between the Schottky electrode 8 and the ohmic electrode 7, the length of part of the Schottky electrode 8 contacting the surface of the electron supply layer 4 and the use conditions of the semiconductor device. However, it is preferred that part of the Schottky electrode 8 contacting the top surface of the insulating film 6 is longer than part of the Schottky electrode 8 contacting the top surface of the semiconductor protection layer 5. For example, when the gap between the Schottky electrode 8 and the ohmic electrode 7 is 3 μm and the length of part of the Schottky electrode 8 contacting the surface of the electron supply layer 4 is 4 μm, the length of part of the field plate 8*c* contacting the top surface of the semiconductor protection layer 5 is set to 1 μm and the length of part of the field plate 8*c* contacting the top surface of the insulating film 6 is set to 2 μm.

The insulating film 6 is preferably made of SiN because it is expected that the surface state density slightly remaining on the surface of the semiconductor protection layer 5 is further reduced. However, $SiO_2$ or other material may be used.

Second Embodiment

Figure 6:
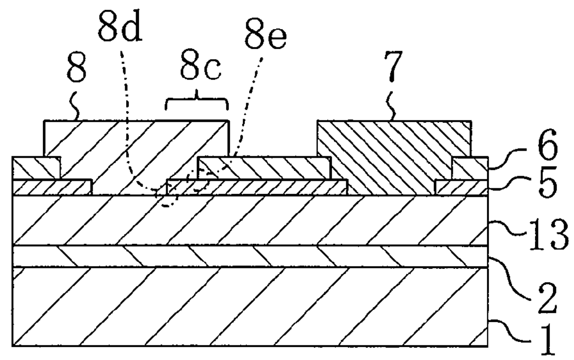
FIG. 6 is a sectional view illustrating a semiconductor device according to a second embodiment of the present invention.

Hereinafter, an explanation of a second embodiment of the present invention will be provided with reference to the drawings. FIG. 6 shows the cross-sectional structure of a semiconductor device according to the second embodiment. In FIG. 6, the same components as those shown in FIG. 5 are indicated by the same reference numerals to omit the explanation. As shown in FIG. 6, the semiconductor device of the present embodiment is an SBD.

A 1 μm thick operation layer 13 made of n-type GaN doped to an impurity concentration of $3\times10^{17}$ $cm^{-3}$ and a 10 nm thick semiconductor protection layer 5 made of undoped AlN are formed in this order from below by epitaxial growth on an AlN buffer layer 2 formed on a sapphire substrate 1. An ohmic electrode 7 including a 10 nm thick titanium (Ti) layer and a 200 nm thick aluminum (Al) layer which are stacked in this order from below and a Schottky electrode 8 including a 50 nm thick nickel (Ni) layer and a 200 nm thick gold (Au) layer which are stacked in this order from below and having a field plate 8*c* are formed to penetrate the semiconductor protection layer 5 to contact the operation layer 13. The ohmic electrode 7 and the Schottky electrode 8 are spaced from each other.

In the present embodiment, the operation layer 13 is made of n-doped GaN and 2DEG generated at the hetero junction interface is not used as the channel. Therefore, as compared with the case of using 2DEG as the channel, the forward current is low. However, the dielectric strength improves easily by adjusting the impurity concentration in the operation layer 13.

The provision of the field plate 8*c* reduces the electric field concentration that occurs at the ends 8*d* and 8*e* of the Schottky electrode 8 facing the ohmic electrode 7 on the application of a reverse bias. As a result, the dielectric strength of the SBD improves. Further, when a forward bias is applied, two dimensional electron gas (2DEG) is generated at part of the interface between the semiconductor protection layer 5 and the operation layer 13 below the field plate 8*c*. As a result, effective contact area between the Schottky electrode 8 and the operation layer 13 increases, thereby allowing large forward bias current to flow.

In the semiconductor device of the present embodiment, an insulating film 6 is formed on the semiconductor protection layer 5 as in the semiconductor device of the second variant of the first embodiment. However, the insulating film 6 may be omitted as in the semiconductor device of the first variant of the first embodiment.

Third Embodiment

Figure 7:
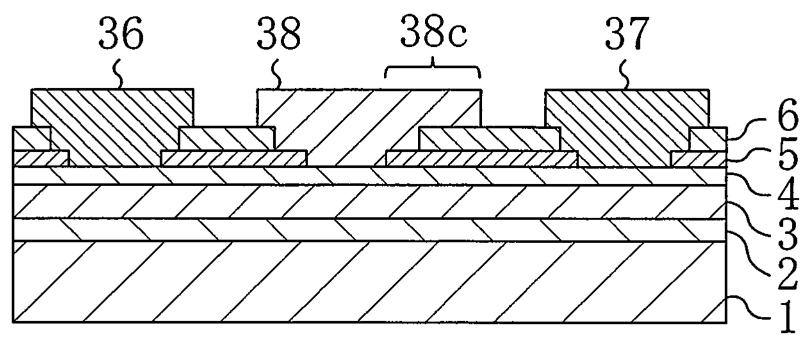
FIG. 7 is a sectional view illustrating a semiconductor device according to a third embodiment of the present invention.

Hereinafter, an explanation of a third embodiment will be provided with reference to the drawings. FIG. 7 shows the cross-sectional structure of a semiconductor device according to the third embodiment. In FIG. 7, the same components as those shown in FIG. 5 are indicated by the same reference numerals to omit the explanation. As shown in FIG. 7, the semiconductor device of the present embodiment is a field effect transistor (FET). The FET includes a source electrode 36 and a drain electrode 37 as ohmic electrodes which are formed to penetrate an insulating film 6 made of SiN and a semiconductor protection layer 5 to contact an electron supply layer 4 and a gate electrode 38 which is formed between the source electrode 36 and the drain electrode 37 to function as a Schottky electrode.

The gate electrode 38 is provided with a field plate 38*c* extending toward the drain electrode 37. The field plate 38*c* is configured to extend in two levels over the semiconductor protection layer 5 and the SiN insulating film 6.

The size of the field plate 38*c* may suitably be adjusted depending on the gap between the gate electrode 38 and the drain electrode 37, the length of part of the gate electrode 38 contacting the surface of the electron supply layer 4 and the use conditions of the semiconductor device. However, it is preferable that part of the gate electrode 38 contacting the top surface of the insulating film 6 is longer than part of the gate electrode 38 contacting the top surface of the semiconductor protection layer 5. For example, when the gap between the gate electrode 38 and the drain electrode 37 is 5 μm and the length of part of the gate electrode 38 contacting the surface of the electron supply layer 4 is 1 μm, the length of part of the field plate 38*c* contacting the top surface of the semiconductor protection layer 5 is set to 1 μm and the length of part of the field plate 38*c* contacting the top surface of the insulating film 6 is set to 2 μm.

In the FET of the present embodiment, the semiconductor protection layer 5 having a large band gap and stability is formed on the electron supply layer 4 so as not to expose the electron supply layer 4. Therefore, leakage current caused by the surface states of the electron supply layer 4 on the application of a reverse bias is significantly reduced. Further, as the gate electrode 38 is provided with the field plate 38*c*, the electric field applied to the end of the gate electrode 38 facing the drain electrode 37 is reduced. As a result, the dielectric strength of the FET improves. Moreover, a decrease in drain current with an increase in frequency, which is a phenomenon called frequency dispersion, is alleviated.

In the semiconductor device of the present embodiment, the insulating film 6 is formed on the semiconductor protection layer 5 as in the semiconductor device of the second variant of the first embodiment. However, the insulating film 6 may be omitted as in the semiconductor device of the first variant of the first embodiment.

Fourth Embodiment

Hereinafter, an explanation of a method for manufacturing a semiconductor device according to a fourth embodiment of the present invention will be provided with reference to the drawings. FIGS. 8A to 8E are sectional views sequentially illustrating the steps of manufacturing the semiconductor device according to the fourth embodiment.

Figure 8A:
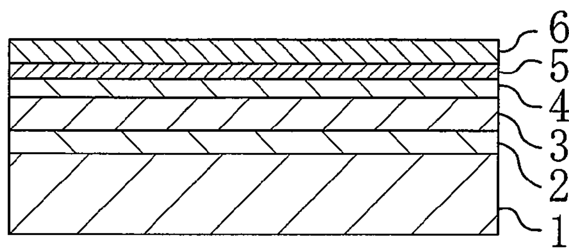
FIGS. 8A to 8E are sectional views sequentially illustrating the steps of manufacturing a semiconductor device according to a fourth embodiment of the present invention.

As shown in FIG. 8A, a 1 μm thick channel layer 3 made of undoped GaN, a 25 nm thick electron supply layer 4 made of partially n-doped $Al_{0.25}Ga_{0.75}N$ and a 10 nm thick semiconductor protection layer 5 made of undoped AlN are grown in this order from below on an AlN buffer layer 2 formed on a sapphire substrate 1 by metal-organic chemical vapor deposition (MOCVD). Further, a 200 nm thick insulating film 6 made of SiN is deposited thereon by plasma CVD.

Figure 8B:
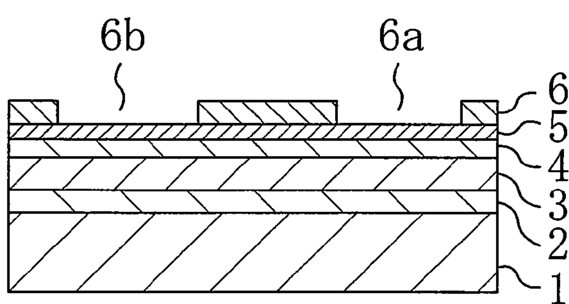

Then, as shown in FIG. 8B, openings 6*a* and 6*b* are formed in the insulating film 6 by patterning using a resist and dry etching such that the semiconductor protection layer 5 is exposed therein.

Figure 8C:
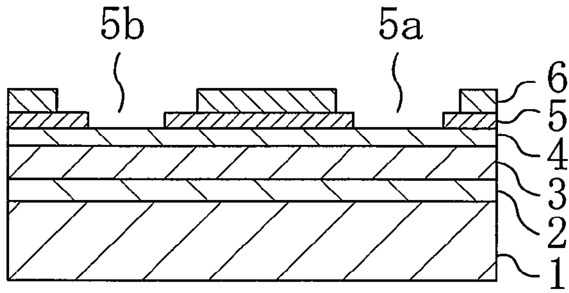

Then, a resist pattern having openings positioned inside the openings 6*a* and 6*b* is formed and the semiconductor protection layer 5 is dry-etched using chlorine gas as an etchant, thereby providing opening 5*a* and 5*b* as shown in FIG. 8C in which the electron supply layer 4 is exposed. Each of the openings 5*a* and 5*b* is stepped, i.e., the electron supply layer 4 is exposed at the bottom and the semiconductor protection layer 5 is exposed in the form of a step.

Figure 8D:
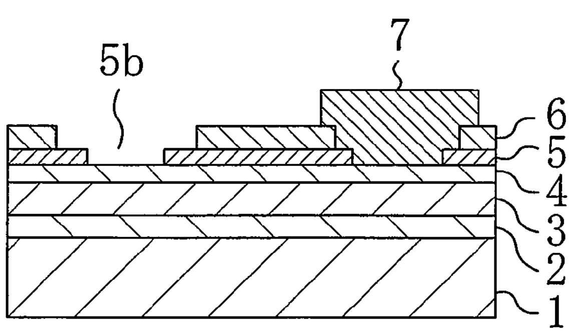

Then, as shown in FIG. 8D, a resist pattern having a larger opening than the opening 5*a* is formed on the insulating film 6. A 10 nm thick Ti layer and a 200 nm thick Al layer are sequentially formed by vapor deposition, followed by lift-off, to form an ohmic electrode 7 which contacts the electron supply layer 4 and extends to form two steps over the semiconductor protection layer 5 and the insulating film 6. Then, heat treatment is carried out at 700° C. to form ohmic contact.

Figure 8E:
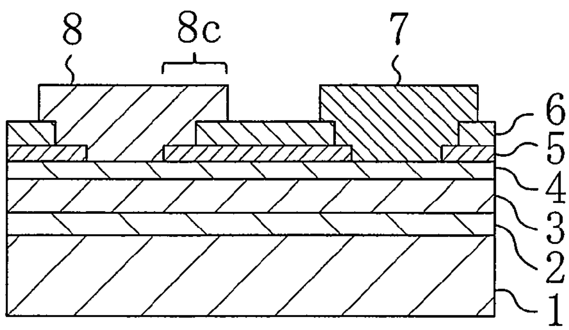

Further, as shown in FIG. 8E, a resist pattern having a larger opening than the opening 5*b* is formed on the insulating film 6. A 50 nm thick Ni layer and a 200 nm thick Au layer are sequentially formed by vapor deposition, followed by lift-off, to form a Schottky electrode 8 having a field plate 8*c*. Then, heat treatment is carried out at 300° C. to obtain excellent Schottky junction.

According to the method for forming the semiconductor device of the fourth embodiment, the channel layer 3, electron supply layer 4 and semiconductor protection layer 5 are epitaxially grown on the substrate in a single film formation process. By so doing, the surface states due to the rearrangement of atoms at the surface of the electron supply layer 4 do not occur, whereby the leakage current is effectively reduced. Further, as the layers are excellently matched and 2DEG is surely generated, the SBD is provided with reduced leakage current and excellent forward current characteristic.

In the present embodiment, the insulating film 6 is deposited before the etching of the semiconductor protection layer 5. However, the order may be changed such that the insulating film 6 is deposited after the etching of the semiconductor protection layer 5. If the deposition of the insulating film 6 is omitted, an SBD including no insulating film 6 as explained in the first variant of the first embodiment is obtained.

Variant of the Fourth Embodiment

Hereinafter, a method for manufacturing a semiconductor device according to a variant of the fourth embodiment of the present invention will be provided with reference to the drawings. FIGS. 9A to 9F are sectional views sequentially illustrating the steps of manufacturing the semiconductor device according to the present variant.

Figure 9A:
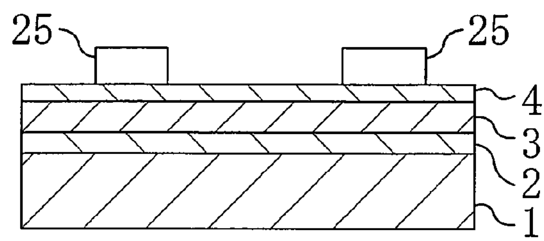
FIGS. 9A to 9F are sectional views sequentially illustrating the steps of manufacturing a semiconductor device according to a variant of the fourth embodiment of the present invention.

As shown in FIG. 9A, a 1 μm thick channel layer 3 made of undoped GaN and a 25 nm thick electron supply layer 4 made of partially n-doped $Al_{0.25}Ga_{0.75}N$ are grown in this order from below by MOCVD on an AlN buffer layer 2 formed on a sapphire substrate 1. Further, a 100 nm thick $SiO_2$ film is deposited thereon by plasma CVD and patterned into a regrowth mask 25.

Figure 9B:
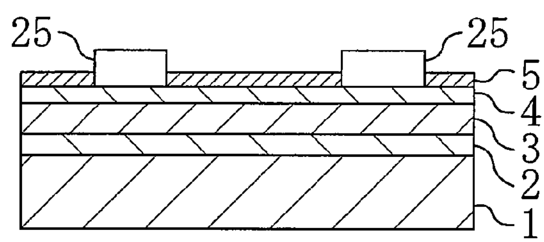

Then, as shown in FIG. 9B, a 10 nm thick semiconductor protection layer 5 made of undoped AlN is regrown on the electron supply layer 4 and the regrowth mask 25 is removed. As AlN does not grow where the regrowth mask 25 has existed, the obtained semiconductor protection layer 5 is provided with openings.

Figure 9C:
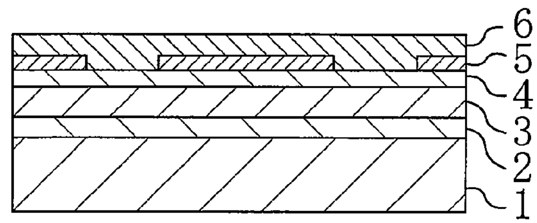

Then, as shown in FIG. 9C, an insulating film 6 made of SiN is deposited on the semiconductor protection layer 5 to fill the openings by plasma CVD.

Figure 9D:
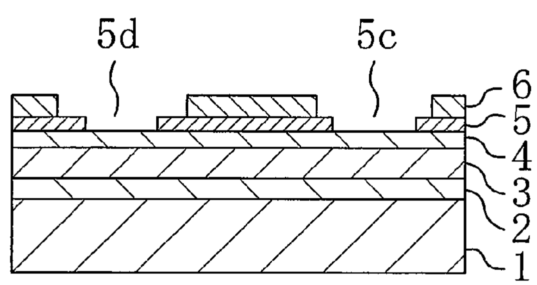

Then, as shown in FIG. 9D, a resist pattern is formed on the SiN film 6, followed by dry etching. As a result, stepped openings 5*c* and 5*d* are formed in which the electron supply layer 4 is exposed at the bottom and the semiconductor protection layer 5 is exposed in the form of a step.

Figure 9E:
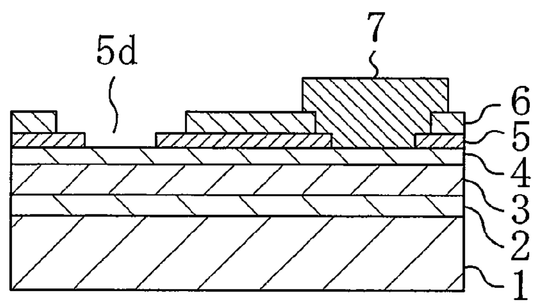

Then, as shown in FIG. 9E, a resist pattern having a larger opening than the opening 5*c* is formed on the insulating film 6. Then, a 10 nm thick Ti layer and a 200 nm thick Al layer are formed by vapor deposition, followed by lift-off, to form an ohmic electrode 7 which contacts the electron supply layer 4 and extends to form two steps over the semiconductor protection layer 5 and the insulating film 6. Thereafter, heat treatment is carried out at 700° C. to form ohmic contact.

Figure 9F:
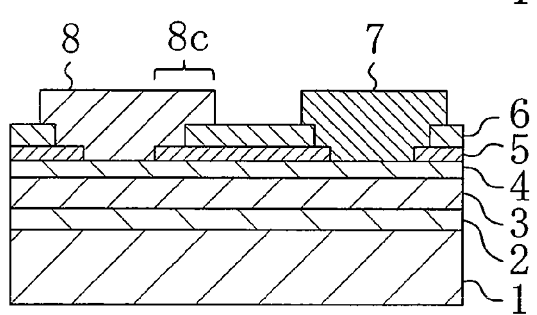
Figure 10:
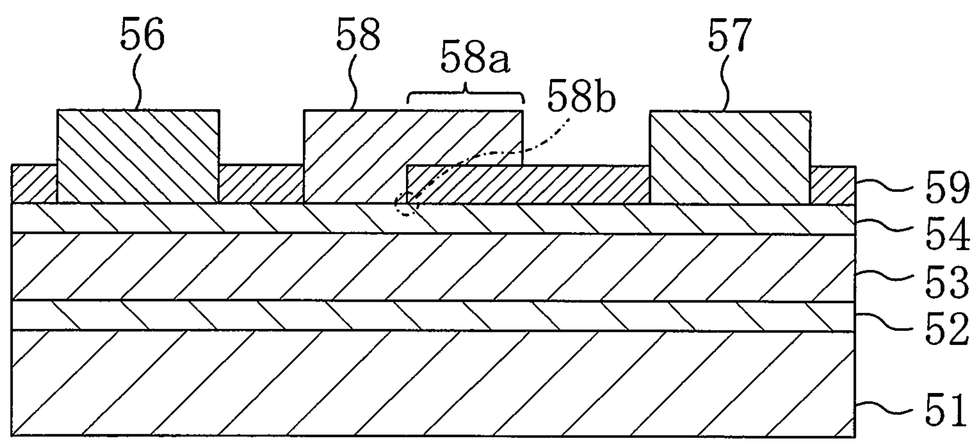
FIG. 10 is a sectional view illustrating a conventional semiconductor device.

Then, as shown in FIG. 9F, a resist pattern having a larger opening than the opening 5*d* is formed on the insulating film 6. Then, a 50 nm thick Ni layer and a 200 nm thick Au layer are formed by vapor deposition, followed by lift-off, to form a Schottky electrode 8 having a field plate 8*c*. Thereafter, heat treatment is carried out at 300° C. to obtain excellent Schottky junction.

In the method for manufacturing the semiconductor device according to the present variant, there is no need to dry-etch the semiconductor protection layer 5. Therefore, the semiconductor protection layer 5 and the electron supply layer 4 are less damaged. Further, the openings are formed only in the semiconductor protection layer 5 without etching the surface of the electron supply layer 4 made of $Al_{0.25}Ga_{0.75}N$.

If the kinds of epitaxially grown semiconductor layers are changed in the fourth embodiment and the variant thereof, the SBD explained in the second embodiment is obtained. Likewise, the FET explained in the third embodiment can also be obtained.

In the embodiments and variants described above, the semiconductor protection layer is configured to have a thickness of 10 nm. Although the thickness of the semiconductor protection layer is not particularly limited in view of the reduction of the leakage current, the thickness is preferably in the range of 3 nm or more to 20 nm or less in consideration that the semiconductor protection layer is epitaxially grown on the electron supply layer or the operation layer. Further, in order to generate 2DEG at the interface between the semiconductor protection layer and the underlying semiconductor layer to increase the forward current, the thickness of the semiconductor protection layer is preferably in the range of 5 nm or more to 15 nm or less.

In the embodiments and variants described above, the semiconductor device is formed on a sapphire substrate. However, the semiconductor device may be formed on a silicon carbide substrate or a gallium nitride substrate. Further, the ohmic electrode which is directly formed on the electron supply layer or the operation layer may be formed on a contact layer which is interposed between the ohmic electrode and the electron supply layer.

Thus, as described above, the semiconductor device and the method for manufacturing the same according to the present invention are useful as a semiconductor device including a Schottky electrode which is made of nitride semiconductor material and capable of reducing the leakage current caused by the surface states of the semiconductor layer on the application of a reverse bias and a method for manufacturing the same.

What is claimed is:

1. A semiconductor device comprising:

a first semiconductor layer which is formed above a substrate;

a gate electrode, a source electrode, and a drain electrode which are formed in direct contact with the first semiconductor layer to be spaced from each other;

a second semiconductor layer which is formed in direct contact with a top surface of the first semiconductor layer to cover the first semiconductor layer with the gate electrode, the source electrode, and the drain electrode exposed, and has a larger band gap than that of the first semiconductor layer; and an insulating film which is formed in direct contact with the second semiconductor layer, wherein the side of the gate electrode facing the drain electrode extends over the top surface of the second semiconductor layer toward the drain electrode, and the side of the gate electrode facing the drain electrode extends over the top surface of the insulating film toward the drain electrode.

2. The semiconductor device according to claim 1, wherein the insulating film is made of silicon nitride.

3. The semiconductor device according to claim 1, wherein the second semiconductor layer is an epitaxial layer, which is epitaxially grown on the first semiconductor layer.

4. The semiconductor device according to claim 1, further comprising:

a third semiconductor layer which is formed between the first semiconductor layer and the substrate and has a smaller band gap than that of the first semiconductor layer.

5. The semiconductor device according to claim 4, wherein the first semiconductor layer is made of a compound represented by the general formula: $Al_xGa_{1-x}N$ ($0.15 \leq x \leq 0.35$), the second semiconductor layer is made of a compound represented by the general formula: $Al_yGa_{1-y}N$ ($x+0.15 \leq y \leq 1$), and the third semiconductor layer is made of gallium nitride.

6. The semiconductor device according to claim 1, wherein the first semiconductor layer contains n-type impurities.

7. The semiconductor device according to claim 1, wherein the gate electrode, the source electrode, and the drain electrode are in direct contact with a lateral side of the second semiconductor layer.

8. The semiconductor device according to claim 1, wherein the second semiconductor layer covers all of the first semiconductor layer except parts below the gate electrode, the source electrode, and the drain electrode.

9. The semiconductor device according to claim 1, wherein the second semiconductor layer is AlN.

10. The semiconductor device according to claim 1, wherein a length of a first portion of the gate electrode contacting a top surface of the insulating film is longer than a length of a second portion of the gate electrode contacting a top surface of the second semiconductor layer, in a direction perpendicular to a thickness direction.

11. The semiconductor device according to claim 1, wherein a thickness of the gate electrode is larger than a thickness of the insulating film.

12. The semiconductor device according to claim 1, wherein a length of the insulating film is shorter than a length of the second semiconductor layer, in a direction perpendicular to a thickness direction.

13. The semiconductor device according to claim 1, wherein a width of an opening formed in the insulating film is longer than a width of an opening formed in the second semiconductor layer, in a direction perpendicular to a thickness direction.

14. The semiconductor device according to claim 1, wherein the first semiconductor layer and the second semiconductor layer are made of a III-V nitride compound semiconductor, respectively.

15. The semiconductor device according to claim 1, wherein the first semiconductor layer is made of a compound represented by the general formula: $Al_xGa_{1-x}N$ $(0.15 \leq x \leq 0.35)$, and the second semiconductor layer is made of a compound represented by the general formula: $Al_yGa_{1-y}N$ $(x+0.15 \leq y \leq 1)$.

* * * * *